(12) United States Patent
Schwarzenbach et al.

(10) Patent No.: US 8,357,587 B2
(45) Date of Patent: Jan. 22, 2013

(54) METHOD FOR ROUTING A CHAMFERED SUBSTRATE

(75) Inventors: Walter Schwarzenbach, Saint Nazaire les Eymes (FR); Aziz Alami-Idrissi, Le Touvet (FR); Alexandre Chibko, Saint Nazaire les Eymes (FR); Sébastien Kerdiles, Saint Ismier (FR)

(73) Assignee: Soitec, Bernin (FR)

( * ) Notice: Subject to any disclaimer, the term of this patent is extended or adjusted under 35 U.S.C. 154(b) by 306 days.

(21) Appl. No.: 12/965,135

(22) Filed: Dec. 10, 2010

(65) Prior Publication Data

US 2011/0140244 A1 Jun. 16, 2011

(30) Foreign Application Priority Data

Dec. 11, 2009 (FR) ..................................... 09 58882

(51) Int. Cl.
*H01L 21/30* (2006.01)
(52) U.S. Cl. ................................ 438/458; 257/E29.022
(58) Field of Classification Search .................... 438/458
See application file for complete search history.

(56) References Cited

U.S. PATENT DOCUMENTS

| | | | | |
|---|---|---|---|---|
| 7,410,885 | B2 * | 8/2008 | Schuehrer et al. | 438/455 |
| 2005/0221584 | A1 * | 10/2005 | Arai | 438/458 |
| 2006/0115986 | A1 | 6/2006 | Donohoe et al. | 438/690 |
| 2007/0072393 | A1 * | 3/2007 | Aspar et al. | 438/459 |
| 2008/0138987 | A1 | 6/2008 | Donohoe et al. | 438/690 |
| 2009/0061545 | A1 | 3/2009 | Donohoe et al. | 438/16 |
| 2010/0022070 | A1 * | 1/2010 | Imahayashi | 438/458 |
| 2011/0053345 | A1 * | 3/2011 | Hanaoka et al. | 438/458 |

FOREIGN PATENT DOCUMENTS

| | | |
|---|---|---|
| EP | 1 156 531 A1 | 11/2001 |
| EP | 1 427 001 A1 | 6/2004 |
| EP | 1 662 560 A2 | 5/2006 |
| JP | 2003-298030 | 10/2003 |
| WO | WO 2005/038903 A1 | 4/2005 |

OTHER PUBLICATIONS

European Search Report, Application No. EP 10187969, dated Feb. 17, 2011.
Search Report for French application No. FR 0958882 dated Jul. 2, 2010.

* cited by examiner

*Primary Examiner* — N. Drew Richards
*Assistant Examiner* — Grant Withers
(74) *Attorney, Agent, or Firm* — Winston & Strawn LLP

(57) ABSTRACT

The invention relates to a method for routing a chamfered substrate, having applications in the field of electronics, optics, or optoelectronics, which involves depositing a layer of a protective material on a peripheral annular zone of the substrate preferably with the aid of a plasma, partially etching the protective material with the aid of a plasma, so as to preserve a protective ring of the deposited material on the front face of the substrate, this ring located at a distance from the edge of the substrate, so as to delimit an accessible peripheral annular zone, etching a thickness of the material constituting the substrate to be routed, preferably with the aid of a plasma that is level with the accessible peripheral annular zone of the substrate, and removing the ring of protective material preferably with the aid of a plasma.

16 Claims, 5 Drawing Sheets

METHOD FOR ROUTING A CHAMFERED SUBSTRATE

FIELD OF THE INVENTION

The general field of the invention is that of the fabrication of substrates intended for applications in the fields of electronics, optics or optoelectronics. In particular, the invention relates to a treatment of donor wafers or substrates having chamfered edges that are to be used for layer transfer.

BACKGROUND OF THE INVENTION

The use of steps of bonding and layer transfer are among the various fabrication methods employed in the field of microelectronic and optoelectronics. According to this method, a first so-called "donor substrate", optionally covered with a layer of insulator which encapsulates it, is subjected to implantation of atomic and/or ionic species in order to create a weakened zone within it. This substrate is subsequently bonded by molecular adhesion to a second so-called "handle" substrate, then the donor substrate is separated into two parts along this weakened zone so that a desired thickness of the material of the donor substrate, and optionally the layer of insulator if it is present, is transferred onto the handle substrate.

After this transfer, the donor substrate becomes a so-called "negative" remainder, whereas the handle substrate becomes a so-called "positive" multilayer substrate. Such a layer transfer method makes it possible in particular to fabricate substrates known by the abbreviation "SOI", standing for "Silicon-On-Insulator", and to do so at a competitive cost, albeit so long as the donor substrate can be recycled.

FIG. 1 schematically represents in cross section the shape of a donor wafer (here the right side) of an example of a negative obtained after a first layer transfer. This is the negative remainder that is recycled in order to form a new donor substrate, which can be used in a fabrication method as described above. This figure shows a negative referenced overall by 1, which comprises a donor substrate 10 having a so-called "front" face 101 because it is the one which was in contact with the handle substrate, and an opposite so-called "rear" face 102. The donor substrate 10 is chamfered in an annular peripheral zone both on its front face and on its rear face. Initially, it was fully covered with a layer of insulator 2, but after separation of the layer of material extending into the non-chamfered region of the substrate, between the front face 101 and the weakened zone 103, it is found that the negative comprises a non-transferred annular ring 104.

This non-transferred ring 104 extends between the boundary 105 of the separation and the outer edge of the substrate or, in other words, is next to the implanted chamfered zone. This non-transferred ring 104 comprises a portion of insulator 2a and a portion of silicon 106. This ring may, for example, have a thickness of several hundreds of nanometers and a width on the order of from 1 to 3 mm. Its presence is associated with the fact that the chamfered portion of the donor substrate does not adhere sufficiently to the handle substrate and is therefore not transferred.

The recycling carried out according to the techniques of the prior art involves eliminating all of the insulator 2, that is to say both the insulator 2a, as well as the insulator 2 present on the rear face and on the edge; eliminating the residual ring 106 of silicon in order to get rid of the step-shaped profile; removing a thickness of silicon corresponding at least to the thickness damaged by the implantation, over the entire front side of the substrate; and polishing the front face of the negative, so as to recover a surface condition referred to as "mirror polished", for example carrying out chemical mechanical polishing known to the person skilled in the art by the abbreviation "CMP".

Such recycling may, for example, be carried out according to the method described in document EP 1 156 531, which consists in carrying out a step of deoxidizing the negative, for example by etching in a bath of acid, a step of grinding the extreme edge of the wafer and finally a step of polishing the implanted surface.

In practice, it is found that equipment which only removes material on the front face of the substrate does not make it possible to remove a regular thickness. For this reason, it is preferable to use equipment that carries out double-sided polishing of the negative, which leads to removal of close to 5 μm of material on each face of the donor substrate.

The aforementioned recycling methods have numerous drawbacks, namely in particular:
- a high cost owing to the presence of at least two, or even three polishing steps that require expensive and bulky equipment which is difficult to maintain and a high consumption of consumable products such as polishing slurries and polishing pads.
- the complexity of the method.
- the large removal of material each time recycling is carried out, on the order of 10 μm, which rapidly leads to substrates being obtained which are too thin and thereby too fragile, in particular after several recycling cycles. Such substrates no longer comply with the SEMI specifications, and therefore can no longer be used again, in particular as handle substrates.

Lastly, another drawback resides in the fact that the implanted but non-bonded annular ring is at least partially degraded during the annealing treatment carried out in order to separate the layer coming from the donor substrate. This results in a bubbling phenomenon which produces very many particles that can contaminate not only the positive but also the equipment subsequently used for various treatments of these wafers, and in particular the equipment for cleaning after separation.

Document WO 2005/038903 describes the transfer of an active layer by assembling two chamfered wafers. In order to prevent a non-bonded wafer edge from breaking in an uncontrolled fashion and inducing the presence of particles on the other surfaces, it is suggested to eliminate an edge zone of the active layer. Since this step is very intricate, document WO 2005/038903 proposes to carry out routing in a peripheral portion of one of the wafers before bonding the two wafers together.

FIG. 2 schematically represents in cross section the shape which a part (here the right side) of a donor substrate of the SOI type would theoretically have after having undergone the treatment of routing before bonding described in document WO2005/038903. However, the solutions proposed in the aforementioned document WO2005/038903 for carrying out the routing do not make it possible to obtain such an abrupt side edge, that is to say one which is as perpendicular to the front face as represented in FIG. 2.

As can be seen for comparison, the layer of insulator 2 and a part of the layer of material of the donor substrate 10 in a peripheral annular zone extending over the front face have been removed, where this removal is carried out for example by etching, over a width corresponding at least to that of the chamfered zone and over a thickness at least equal to the depth of the implantation zone. The active layer delimited by the weakened zone has the reference 107.

Specifically, tests carried out by the Applicant, by using an approach that involves successively etching the layers of silicon oxide then of silicon with the aid of a plasma, have shown that the routing obtained has a shallow slope as represented in appended FIG. 3A. Inter alia, etching of the silicon oxide continues during the step of etching the silicon.

Furthermore, and as can be seen in FIG. 3B, the resulting negative retains a non-transferred ring including a layer of oxide and a layer of implanted silicon, which substantially impairs the advantages expected of the routing method for future recycling of the negative.

Lastly, the routing solution proposed in document WO2005/038903 involves protecting the treated positive substrate by depositing a protective layer (for example of oxide), then removing an annular peripheral ring of it by lithography, carrying out the routing by etching the unprotected layer of the positive, and subsequently removing the protective mask. The use of an additional step of forming a protective mask, however, increases the costs and, above all, is a source of contamination. Moreover, it is preferable to avoid introducing impurities before the bonding since the intention is to reduce the defectiveness of the substrates obtained.

The Bosch method or process is also a known method that involves covering the front face of a substrate with the aid of a mask then, by anisotropic etching of this mask, in forming patterns on the order of one micrometer on the front face with a view to subsequently forming electronic or electromechanical components, but in no case in routing the edges of a full wafer over a width of 2 or 3 mm.

The aim of the invention is to resolve the aforementioned drawbacks of the prior art.

SUMMARY OF THE INVENTION

The present invention relates to a method for forming a routed substrate, which comprises: depositing a layer of a protective material with the aid of a plasma on a peripheral annular zone of a substrate, wherein the peripheral annular zone includes a chamfered edge of the substrate; partially etching the protective material with the aid of a plasma to remove an outer ring of protective material while preserving an inner ring of protective material on the front face of the substrate to be routed, where the removed outer ring is extending from at least the inner radial edge of the chamfered zone to the edge of the substrate, so as to delimit a reduced peripheral annular zone of the substrate, while leaving a ring of protective material inside the reduced peripheral annular zone; generating a partial etching plasma, localized at the level of the reduced peripheral annular zone of the substrate, so as to etch the substrate material exposed in the peripheral annular zone to remove a certain thickness; and removing the ring of protective material with the aid of a plasma.

The etching according to the method can be carried out in a chamber for forming an isotropic plasma, wherein the substrate, having a front face and a rear face, is introduced into and positioned within the chamber, and further wherein the chamber is equipped with two insulating elements in the form of discs, and two electrodes in the form of annular rings, such that the rear face of the substrate is in contact with a lower electrode and lower insulating element, wherein the lower electrode and lower insulating element define a rear-face exclusion zone not accessible to the isotropic plasma, and an upper electrode and upper insulating element are positioned a distance from the front face of the substrate, so as to define a front-face exclusion zone also not accessible to the plasma.

The method can further comprise depositing the layer of protective material onto the peripheral annular zone with the aid of an isotropic plasma formed in the chamber, moving the upper insulating element towards the front face of the substrate to a lowered position; partially etching the protective material, while keeping the upper insulating element in the lowered position, to remove an exposed portion of protective material; generating a partial etching plasma to thereby etch a thickness of the material constituting the substrate to be routed; and moving the upper insulating element away from the front face of the substrate for removing the ring of protective material remaining after the partial etching.

The outer diameters of the upper and lower insulating elements are less than the diameter of the substrate to be routed, such that the unexcluded portion of the substrate constitutes the peripheral annular zone.

The diameter of the upper insulating element can be less than or equal to the diameter of the non-chamfered plane zone of the front face of the substrate to be routed.

The protective material can be a polymer, such as polyethylene, obtained by a plasma from $C_2H_4$. The plasma used for partially etching the protective material can then be an oxygen-based plasma.

If the substrate to be routed is made of silicon; the etching plasma is based on a mixture of $SF_6$ and argon, whereas if the substrate to be routed is covered with a layer of silicon oxide; the etching plasma is based on a mixture of $CHF_3$ and nitrogen. Finally, if the substrate to be routed is made of silicon covered with a layer of silicon oxide, the etching of the silicon oxide layer with a mixture of $CHF_3$ and nitrogen; and the etching of a thickness of the silicon layer with a mixture of $SF_6$ and argon, are carried out successively.

In another embodiment of the invention, the substrate to be routed comprises a weakened zone which extends in a plane parallel or substantially parallel to its front face.

The partial etching of the protective material is carried out so that the outer diameter of the ring of protective material formed in this way is less than or equal to the diameter of the non-chamfered plane zone of the front face, such that the material constituting the substrate to be routed can be etched over a width of at least all of the chamfered zone.

The substrate to be routed comprises a weakened zone which extends in a plane parallel or substantially parallel to its front face, and in that it is etched over a thickness corresponding to the depth of the weakened zone.

Another aspect of the present invention includes the method for fabricating a composite substrate which comprises: forming a weakened zone at a depth within a donor substrate, wherein the weakened zone is formed by implantation of atomic and/or ionic species, so as to delimit thereon a layer to be transferred from the donor substrate to a handle substrate; subjecting the donor substrate to a routing method described above; bonding the routed donor substrate to a handle substrate by molecular adhesion; and carrying out a treatment for separating the layer to be transferred along the weakened zone, so as to transfer it onto the handle substrate.

Another aspect of the present invention includes a routed substrate, which comprises: the substrate implanted with ions to an implantation depth to define a weakened zone; and a sharp routed edge, which is perpendicular or almost perpendicular to the plane of the front face of the substrate and has a thickness determined by the depth of the implantation. The substrate can further comprise a transition zone of the routed edge between the routed portion of the substrate and the non-routed portion that is less than approximately 0.1 mm.

Additional embodiments of the invention relate to routed chamfered substrates prepared by the routing methods disclosed herein, as well as to composite substrates prepared by the preparation methods disclosed herein.

BRIEF DESCRIPTION OF THE DRAWINGS

Other characteristics and advantages of the invention will become apparent from the following description of particular embodiments of the invention, given by way of non-limiting examples, with reference to the appended drawings in which.

DETAILED DESCRIPTION OF THE INVENTION

Figure 1:
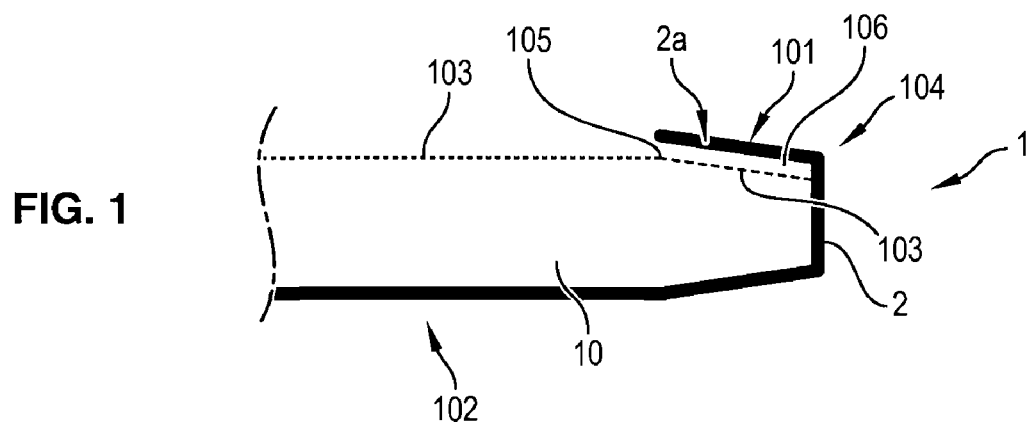
FIG. 1 schematically represents in cross section, the shape of a donor wafer (here the right side) of a negative obtained after a first layer transfer illustrating a problem with the methods of the prior art.
Figure 2:
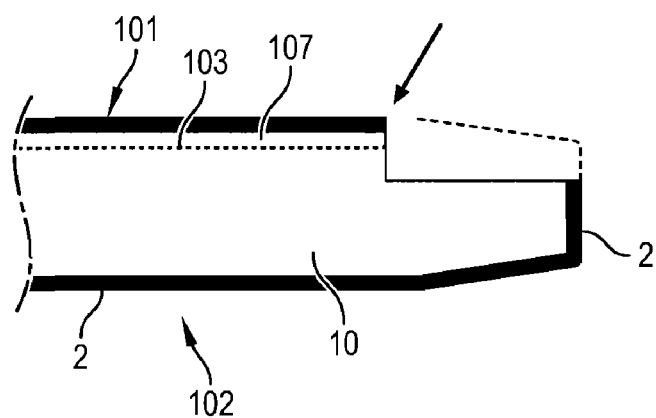
FIG. 2 schematically represents in cross section, the expected shape of an edge (here the right side) of a donor substrate of the SOI type would theoretically have after having undergone the routing treatment described in document WO2005/038903.

The present invention relates to a method for routing a chamfered substrate, which makes it possible to obtain a sharp routed edge that is perpendicular or almost perpendicular to the plane front face of the substrate, without increasing the defectiveness of the substrate. The present invention offers a method that does not increase the fabrication costs and can be integrated easily into the production lines currently used in the field of microelectronics. Lastly, the routing method is usable in a layer transfer method.

According to a first non-limiting embodiment of the invention, the method comprises the steps of depositing a layer of a protective material on a peripheral annular zone of the substrate with the aid of a plasma, partially etching the protective material with the aid of a plasma, so as to remove a ring of protective material extending from the edge of the substrate to expose the chamfered edge, while preserving a ring of protective material on the front face of the substrate to be routed, this remaining ring extending at a distance from the edge of the substrate, so as to delimit a reduced peripheral annular zone of the substrate, which is accessible to a plasma. The area of the peripheral annular zone covered by protective material, therefore, is reduced by at least the width of the chamfer, and is bounded by the edge of the substrate and the preserved ring of protective material.

The method further comprises generating a partial etching plasma, localized at the level or position of the reduced accessible peripheral annular zone of the substrate, so as to removing the ring of protective material with the aid of a plasma, and etch the material present in this zone to remove a certain thickness to produce a routed part of the substrate. The routed part extends over a width from the edge of the wafer, inward at least to the beginning of the chamfered zone or region.

According to other advantageous and non-limiting embodiments of the present invention, the various steps of the method, taken separately or in combination, are carried out in a chamber for forming an isotropic plasma, this method comprises the steps of introducing the substrate to be routed into a chamber for forming an isotropic plasma that is equipped with an upper insulator or insulating element in the form of a disc and two electrodes. One of the electrodes, referred to as the "lower" electrode, has a disc shape, and is surrounded by a lower insulator or insulating element also having a circular or annular contour. The substrate is arranged in the chamber, so that its rear face is in contact with the lower electrode and with the lower insulating element, so as to define a rear-face exclusion zone not accessible to the plasma. The second electrode, referred to as the "upper" electrode, and upper insulator or insulating element are positioned at a distance from the front face of the substrate; and the upper insulating element is positioned so as to define a front-face exclusion zone, which is also not accessible to the plasma. The outer diameters of the two insulating elements, both lower and upper, are less than the diameter of the substrate to be routed; the rest of the substrate constituting the peripheral annular zone. The diameter of the upper insulating element in particular is less than or equal to that of the non-chamfered plane zone of the substrate to be routed, such that the exclusion zone on the front face is defined in such a way, when the upper insulating element is in the lowered position, as to exclude that region of the substrate from being etched.

The method then comprises: depositing the layer of protective material onto the peripheral annular zone with the aid of the plasma formed in the chamber, moving the upper insulating element towards the front face of the substrate and carrying out a partial etching of the deposited protective material from the region overlying the chamfered edge, then, while keeping the upper insulating element in its lowered position to preserve a ring of protective material, etching a thickness of the material constituting the substrate to be routed, followed by moving the upper insulating element away from the front face of the substrate and removing the remaining ring of protective material using an oxygen-based plasma.

The partial etching of the protective material is carried out so that the outer diameter of the ring of protective material formed in this way is less than or equal to that of the non-chamfered plane zone of the front face. The substrate to be routed is thereby exposed over a width corresponding at least to all of the chamfered zone.

The protective material is preferably a polymer, where the polymeric protective material can be polyethylene that is obtained by a plasma based on ethylene ($C_2H_4$). The plasma used for etching or otherwise removing this protective material is an oxygen-based plasma.

The plasma used for etching the substrate is based on a mixture of $SF_6$ and argon, when the substrate to be routed is made of silicon. When the substrate to be routed is covered with a layer of silicon oxide, the etching plasma is based on a mixture of $CHF_3$ and nitrogen; and when the substrate to be routed is made of silicon covered with a layer of silicon oxide, the etching of the silicon oxide layer and the etching of a thickness of the silicon layer are carried out successively.

The substrate to be routed comprises a weakened zone which extends in a plane parallel or substantially parallel to its front face, and it is etched at least to a depth corresponding to that of the weakened zone.

The invention also relates to a method for fabricating a substrate intended for applications in the field of electronics, optics or optoelectronics. This method comprises the following steps: forming a weakened zone inside a donor substrate, so as to delimit thereon a layer to be transferred from the rest of the substrate, subjecting this donor substrate to a routing method such as that described above, bonding the donor substrate routed in this way onto a handle substrate by molecular adhesion, carrying out a treatment for separating the layer to be transferred along the weakened zone, so as to split a thin active layer from the donor substrate and transfer it onto the handle substrate. According to one specific embodiment, the weakened zone is formed by implantation of atomic and/or ionic species.

Another aspect of the invention relates to the routed substrate or structure formed by the above method. The routed substrate comprises a sharp routed edge, produced by the present plasma etching method, which is perpendicular or almost perpendicular to the plane front face of the substrate and has a thickness determined by the depth of the implantation. The width of the region of the chamfered substrate etched by the plasma corresponds to at least the entire chamfered zone. The substrate also has a transition zone between the routed portion of the substrate and the non-routed portion that is small, for example approximately 0.1 mm. The width of the transition zone of the routed substrate produced by the present method is approximately one-tenth the width resulting from the prior art methods.

A non-limiting example of a method for routing a chamfered substrate according to a preferred embodiment of the present invention will now be described with reference to FIGS. 6A to 6D.

FIGS. 6A to 6D are diagrams representing a partial cross section of the substrate to be routed and the installation for carrying out the routing method of the invention, respectively during the various successive steps of the method.

Figure 6A:
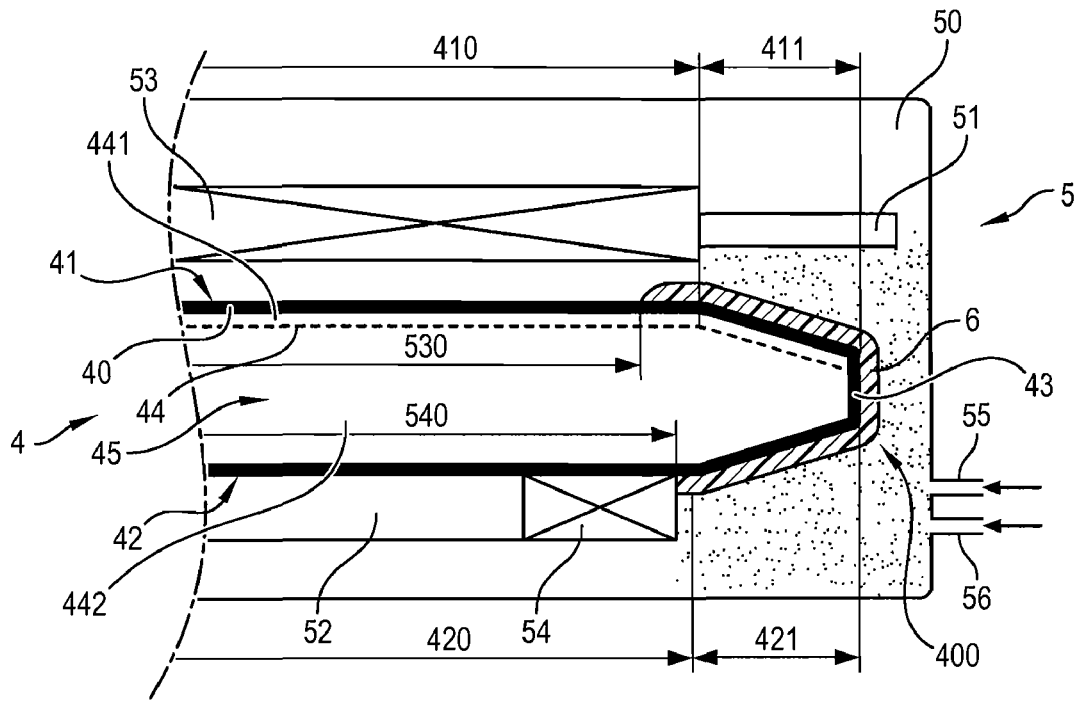
FIGS. 6A to 6D are diagrams representing a partial cross section of the substrate to be routed and the installation for carrying out the routing method of the invention, respectively during the various successive steps of the method.

The substrate to be routed is described in reference to FIG. 6A. The diagram is not representative of the true scale of the substrate with respect to the installation. Likewise, the proportions of the substrate have been modified in order to facilitate the explanation. This figure shows a substrate to be routed, which has the general reference 4 and which has a front face 41, an opposite rear face 42 and a lateral side edge 43. This substrate 4 is chamfered, so that its front face 41 is divided into a non-chamfered plane central zone 410 and a chamfered zone 411 and, likewise, its rear face 42 is divided into a non-chamfered plane central zone 420 and a chamfered zone 421.

In this exemplary embodiment, the substrate 4 comprises a wafer 45 covered on all of its outer surface with an layer of insulator 40, however the presence of the oxide layer is optional.

The routing method may be applied to any type of substrate, although it has a particular application in the routing of a substrate provided with a weakened zone 44, this substrate being intended to be used subsequently in a method of bonding and layer transfer.

The weakened zone 44 delimits an active layer 441 which extends as far as the front face 41 of the rest 442 of the substrate.

Advantageously, this weakened zone 44 is formed by implantation of atomic and/or ionic species according to the implantation method developed in conjunction with the technique known to the person skilled in the art by the name "Smart cut".

This weakened zone 44 could also comprise a porous layer.

The routing method of the invention may be carried out, for example, inside a reactor 5 for forming a plasma, such as the one represented in FIGS. 6A to 6D.

This reactor comprises a chamber 50, inside which two insulating elements 53, 54 and two electrodes 51, 52 are installed, the latter being connected to an electrical power supply (not represented in the figures).

The substrate 4 to be routed rests on the lower electrode 52 and the lower insulating element 54, via its rear face 42.

The lower electrode 52 is surrounded by the lower insulating element 54, which has an annular or circular contour. Preferably, the electrode 52 is circular disc and the insulating element 54 is annular.

Furthermore, the upper insulating element 53 has the shape of a disc and the electrode 51 which surrounds it is of annular shape.

The upper insulating element 53 is mounted on motor means (not represented in the figures) which allows it to translate or be displaced along a vertical axis perpendicular to the median plane of the substrate 4. It can thus be displaced between a position represented in FIG. 6D in which it is maximally separated from the substrate 4 to be routed, and a position represented in FIGS. 6B and 6C in which it is brought close to this substrate 4.

The gases used for forming the plasma are introduced into the chamber 50 via pipelines, for example two of them illustrated as references 55 and 56.

The volatile materials, which are produced during the reaction which takes place inside the chamber 50, may be discharged from it by suction means and an orifice (which are not represented in the figures).

The electrodes 51 and 52 have a voltage applied to them, the effect of which is to create an electric field inside the chamber 50 and convert the gases introduced in the pipelines 55 and 56 into a plasma.

Various parameters, such as the temperature and pressure prevailing inside the chamber 50, the nature, flow rate and ratios of the gases introduced into the chamber 50, the frequency of the plasma, and the voltage (or the power) applied to the terminals of the electrodes 51 and 52 have an effect on the chemical composition of the plasma being formed and on its nature, namely a deposition plasma or an etching plasma. Details of these parameters will be given below.

Preferably, the plasma formed both for the deposition and for the etching is isotropic. This means that the action of the plasma is preferably achieved by means of radicals created in the plasma, and could optionally be achieved by means of ions accelerated in the envelope of the plasma.

The fact that the rear face 42 of the substrate 4 is in contact with the lower electrode 52 and the lower insulating element 54 makes it possible to define a rear-face exclusion zone, referenced 540, which is not accessible to the plasma because it is masked.

As can be seen in the figures, the outer diameter of the lower insulating element 54 corresponds exactly to the diameter of the rear-face exclusion zone 540, since the substrate 4 to be routed is directly in contact with the insulating element 54.

Furthermore, the substrate 4 to be routed is quite clearly arranged so as to be centered with respect to the annular insulating element 54.

Moreover, the upper insulating element 53 also makes it possible to define a so-called "front-face exclusion" zone 530, not accessible to the plasma, on the front face 41 of the substrate 4.

The effective diameter of the front-face exclusion zone 530 depends not only on the diameter of the upper insulating element 53, but also on its distance from the substrate 4 to be routed. Thus, the further the insulating element 53 is displaced away from the front face 41 of the substrate, the smaller is the diameter which the front-face exclusion zone 530 has (see FIG. 6A), and conversely the closer it is thereto, the larger is the diameter of this zone 530 (see FIG. 6B).

The annular peripheral zone of the substrate 4 which remains accessible to the plasma, that is to say the zone which extends outside the aforementioned exclusion zones 530 and 540, is referenced 400. In other words, this peripheral annular zone 400 comprises the side edge 43 of the substrate, the chamfered zones 411 and 421, and optionally a part of the periphery of the front 41 and rear 42 faces.

The various steps of the routing method will now be described.

After the substrate 4 to be routed has been introduced into the chamber 50, and positioned so that its rear face 42 rests against the insulating element 54 and the lower electrode 52, the parameters for forming the plasma are adjusted so as to deposit a layer of a protective material 6 onto the accessible annular zone 400.

Preferably, this protective material 6 is a polymer, and more preferably, it is polyethylene obtained with the aid of a plasma based on ethylene ($C_2H_4$).

The upper insulating element 53 is subsequently moved towards the front face 41 of the substrate 4, so as to enlarge the front-face exclusion zone 530 and increase its diameter. It will be noted that the insulating element 53 is never brought in contact with the upper face 41 of the substrate, so as to avoid damaging it or contaminating it.

Figure 6B:
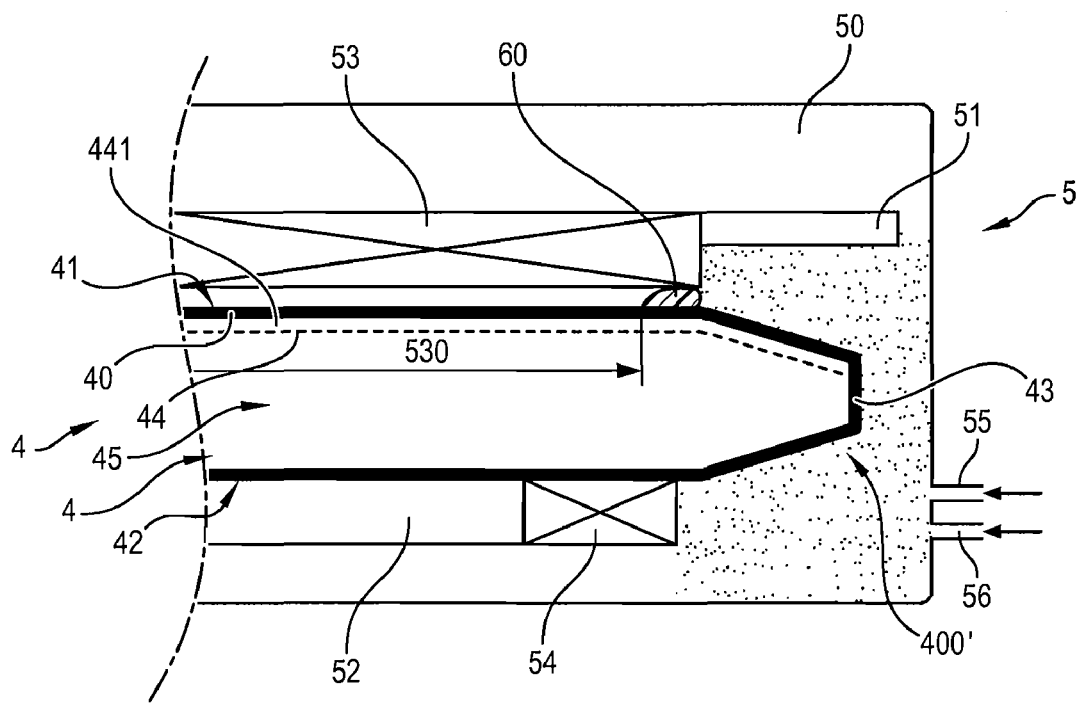

In this position, which is illustrated in FIG. 6B, the parameters of the plasma are adapted so as to carry out partial etching of the protective material 6. This etching is partial, so that it makes it possible to preserve only a ring 60 of protective material on the front face 41 of the substrate 4.

This partial etching is possible owing to the enlargement of the front-face exclusion zone 530. In the position of the insulating element 53 as represented in FIG. 6A, the zone where the ring 60 lies is accessible to the plasma and it has been possible to deposit the protective material 6 there. Conversely, when the insulating element 53 is lowered, the portion of the protective material corresponding to the ring 60 is no longer accessible to the plasma, and is therefore not etched by it. In other words, when the area of the front-face exclusion zone 530 increases, that of the accessible zone 400 decreases. The reduced accessible zone has the reference 400'.

The nature of the plasma for etching the protective material 6 quite clearly depends on the chemical nature of this material.

By way of example, for a protective material comprising polyethylene, the etching is carried out with a plasma based on oxygen ($O_2$).

Figure 6C:
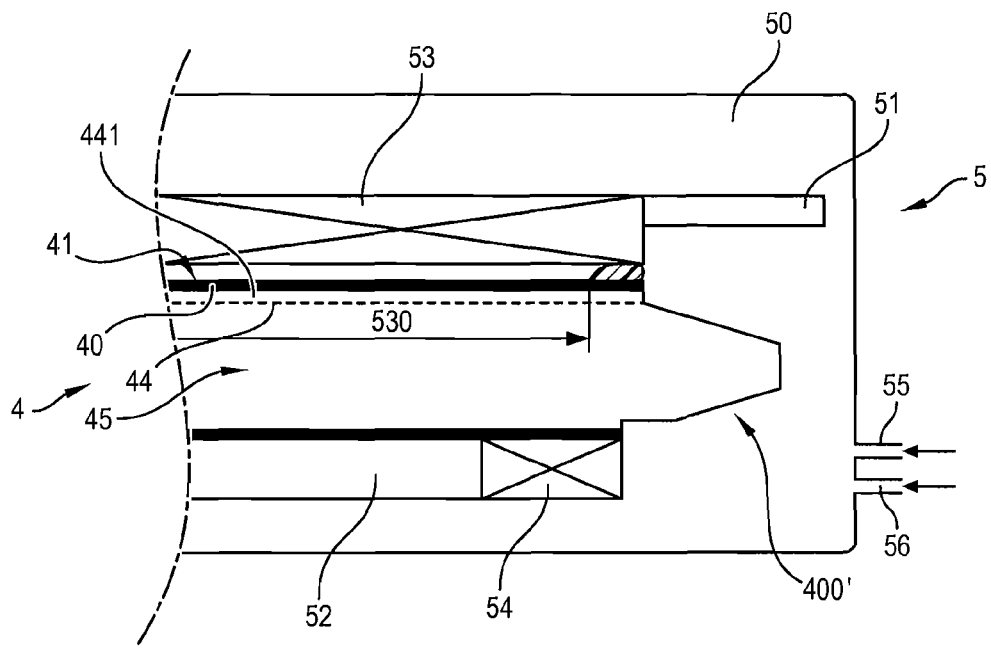

The next step is illustrated in FIG. 6C. While keeping the upper insulating element 53 in the position represented in FIG. 6B, the nature of the gases introduced into the chamber 50 is modified so as to create a plasma adapted to etch a thickness of the material constituting the substrate 4 to be routed. This etching is carried out only in the peripheral annular zone 400' of the substrate, which is a residual zone accessible to the plasma, in view of the presence of the ring 60.

In the particular case in which a layer of insulator 40 is present, and in particular when it is an oxide layer, the etching plasma will then be based on a mixture of nitrogen and trifluoromethane ($CHF_3$).

When the insulator 40 has been entirely etched in the residual accessible zone 400', the gases introduced into the chamber are modified so as to etch the material constituting the wafer 45.

By way of example, when the material constituting wafer 45 is silicon, the etching plasma is based on a mixture of argon and sulfur hexafluoride ($SF_6$) and optionally nitrogen ($N_2$).

As represented in FIG. 6C, a substrate 4 is obtained which is routed at its periphery not only on its front face and its rear face, but also on its side.

As an illustrative example, and in particular for applications to bonding and transfer of layers, the routed part extends over a width of the order of from 0.5 to 3 mm from the edge of the wafer, preferably from 1 to 2 mm, ideally 1.2 mm. The depth of the routing corresponds to the thickness of the transfer after bonding. It therefore comprises the thickness of the layer of insulator 40 if it is present (typically close to 1500 Å (150 nm), more generally lying between 100 & 4000 Å (10 nm and 400 nm)) plus the thickness of the substrate layer which is intended to be transferred subsequently, i.e. typically for the fabrication of an SOI between 1000 and 10 000 Å (100 and 1000 nm), preferably of the order of 2500 Å (250 nm).

Figure 6D:
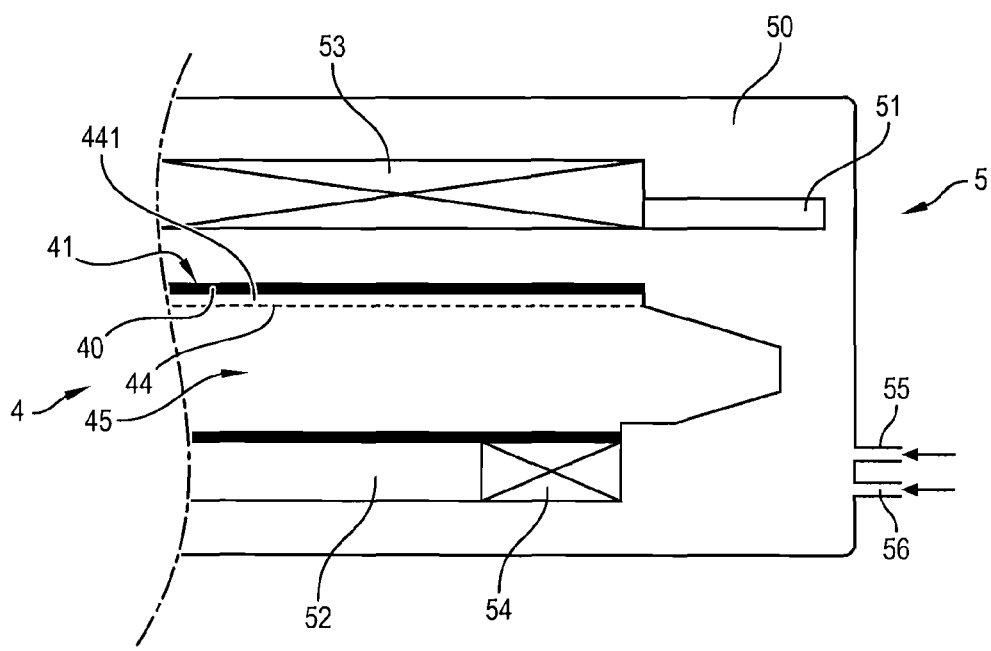

Lastly, as represented in FIG. 6D, the upper insulating element 53 is then moved away from the front face 41 of the substrate 4 and the parameters of the plasma are modified so as to create an etching plasma making it possible to remove the ring 60 of protective material. This etching plasma is generally the same as that used in the etching step represented in FIG. 6B.

For all the steps which have just been described, and which relate to the use of a deposition plasma and an etching plasma, the conventional frequency of the plasma is 13.56 MHz. The power is of the order of 100 to 500 W. The application time of the plasma varies between 5 and 40 seconds. The combination of the power and the duration of the plasma induces, in particular, an effect on the etched thickness. Finally, the pressure inside the chamber is of the order of a few Torr (1 Torr is approximately equal to 102 Pa).

When the substrate to be routed comprises a weakened zone 44, the diameter of the upper insulating element 53 and its position will advantageously be determined so that the outer diameter of the ring 60 corresponds to that of the non-chamfered front plane zone 410.

Thus, it is impossible to etch the substrate 4 only on the chamfered part 411 of its front face.

The outer diameter of the ring 60 of the protective layer could however be less than that represented in the figures, that is to say the position of the ring 60 is displaced to the left of the figures. This, however, would also lead to the etching of a portion of the non-chamfered front plane zone 410, which will be less advantageous economically.

This procedure makes it possible to ensure removal of all of the chamfered zone 411 of the front face which has undergone the implantation. This thus limits the risk of subsequent contamination as described above.

Also advantageously, the etched layer of material of the substrate 4 corresponds to the thickness of material which extends between the front face and the weakened zone 44.

Figure 5A:
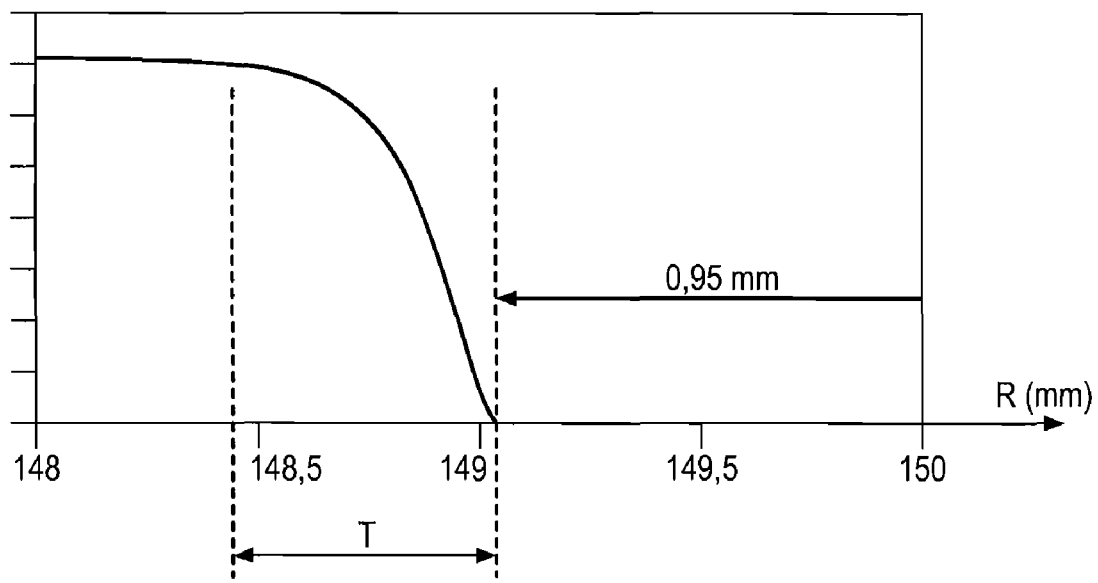
FIGS. 5A and 5B are graphs representing the cross-sectional profile of the oxide of a routed substrate, as a function of the radius R of the substrate expressed in mm, respectively with a prior art method and with the method according to the invention.
Figure 5B:
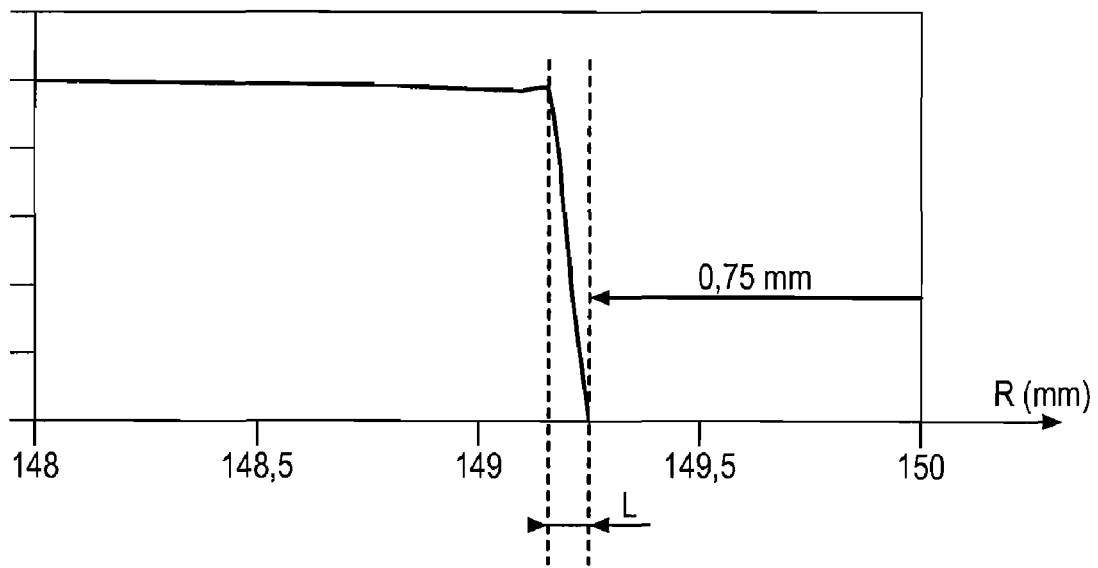

FIGS. 5A and 5B are graphs representing the cross-sectional profile of the oxide of a routed substrate, as a function of the radius R of the substrate expressed in mm, respectively with a prior art method and with the method according to the invention.

After routing, a sharp-edged substrate is obtained such as the one represented in FIG. 5B. In other words, the width of the transition zone T between the non-routed part of the substrate lying on the left of the figure, and the routed part lying on the right of the figure, is small.

Figure 3A:
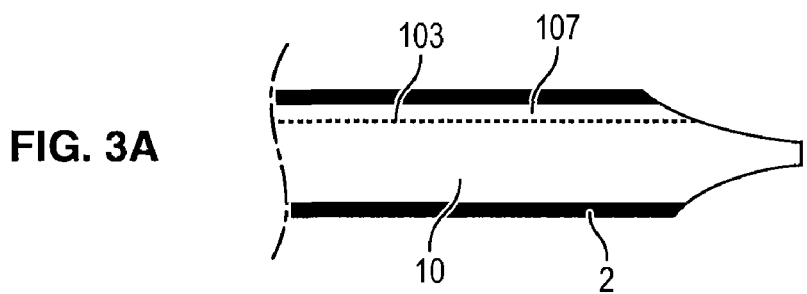
FIG. 3A schematically represents in cross section, the actual shape of an edge of a donor wafer resulting from the routing treatment described in document WO2005/038903.
Figure 3B:
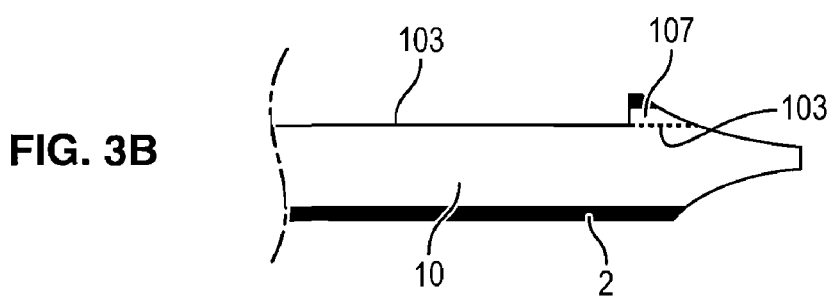
FIG. 3B schematically represents in cross section, the negative resulting from the routing treatment described in document WO2005/038903 retains a non-transferred ring including a layer of oxide and a layer of implanted silicon.

By way of comparison, FIG. 5A illustrates the results obtained with a routing method of the prior art, according to which first plasma etching of the oxide layer followed by second plasma etching of the silicon layer has been carried out, but without application of an annular protective deposit. The slope of the etching is degraded in this case, on the one hand because the etching of the oxide is not limited by a protective layer and on the other hand because, the selectivity not being perfect, the etching of the silicon also induces slight etching of the oxide. It is easy to see that in this case, the transition zone T between the respectively routed and non-routed parts of the substrate is much wider. The situation is then as represented in FIG. 3A.

In view of the examples given above, it can be seen that the method according to the invention makes it possible to reduce the width of this transition zone T by a factor of about 10.

Figure 4A:
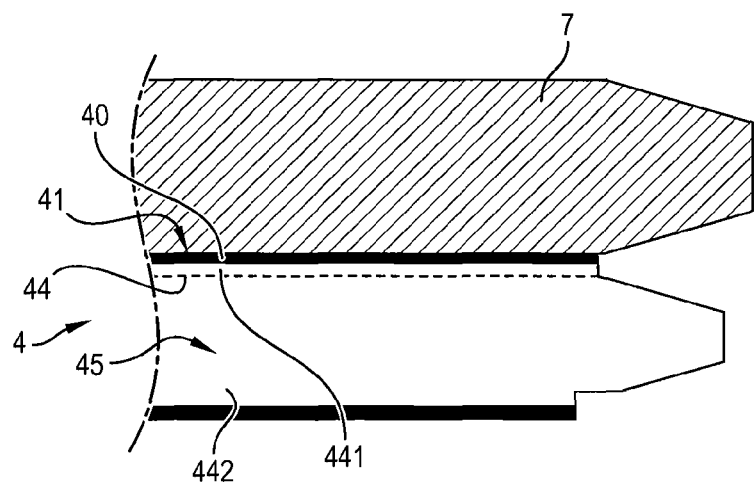
FIGS. 4A and 4B schematically represent a cross section of the right ends of a donor substrate which has undergone the routing method according to the invention bonded to a handle substrate, before and after the two substrates have undergone a separation step.
Figure 4B:
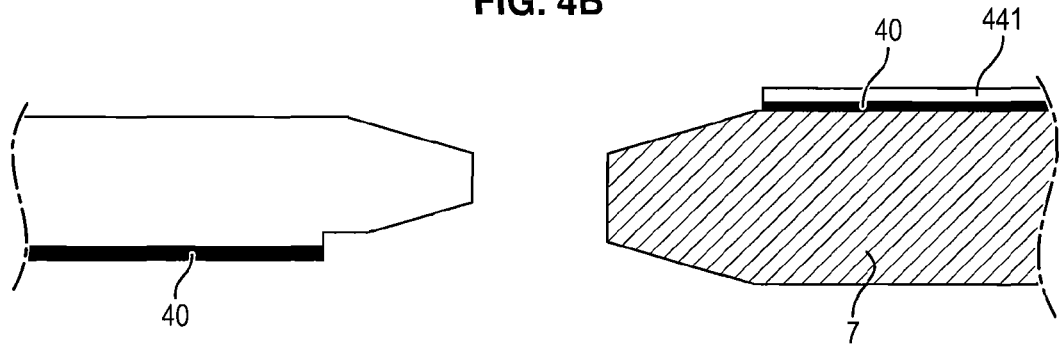

FIGS. 4A to 4B illustrate the various steps of a method for fabricating a multilayer substrate which, after having formed a weakened zone 44 within the donor substrate 4, comprises subjecting it to a routing method such as the one described above. These drawings schematically represent a cross section of respectively, the right ends of a donor substrate which has undergone the routing method according to the invention, bonded on a handle substrate, and the same two substrates after the separation step.

The routed donor substrate 4 is subsequently bonded onto a handle substrate 7 (see FIG. 4A), then is subjected to a separating treatment that is generally known to those skilled in the art aiming to transfer its active layer 441 onto the handle substrate 7 (see FIG. 4B).

The advantages obtained by using this method are as follows:
- the positive obtained has an active layer 441 delimited well by the limit of etching;
- by taking care to etch a thickness of material corresponding to the thickness determined by the depth of the implantation, the negative obtained no longer has a non-transferred ring. Thus, no step is present at the edge of the wafer (see the left-hand part of FIG. 4);
- recycling of the negative is thereby greatly simplified, and may be limited to a CMP step whose aim is to remove the region damaged by the implantation, in order to recover a "mirror polished" surface condition;
- the recycling is also less expensive since it comprises fewer steps and consumes less primary material, thus allowing the post-recycling substrate to remain compatible with the SEMI standards in respect of its thickness, even after several recycling operations;
- lastly, by means of this, the fracture step becomes a step generating far fewer particles. The ring of the SOI substrates obtained in this way is more regular (and even more controlled in respect of its width) and free of silicon particles bonded at the wafer edge.

It is to be understood that some or all of the above described features and steps can be combined in different ways, and other variations and modifications will be apparent to those of ordinary skill in the art. It is intended that all of these embodiments, examples, variations and modifications thereon are meant to be encompassed within the spirit and scope of the present invention as set forth in the following claims.

What is claimed is:

1. A method for forming a routed substrate, which comprises:
   depositing a layer of a protective material on a peripheral annular zone of a substrate, wherein the peripheral annular zone includes a chamfered edge of the substrate;
   partially etching the protective material to preserve a ring of protective material on the front face of the substrate and extending from at least the inner radial edge of the chamfered zone to the edge of the substrate, so that the ring of protective material delimits a reduced peripheral annular zone of the substrate;
   generating a partial etching plasma, so as to etch the substrate material exposed in the peripheral annular zone to remove a certain thickness; and
   removing the ring of protective material with the aid of a plasma to prepare the routed substrate.

2. The method according to claim 1, wherein the etching is carried out in a chamber for forming an isotropic plasma.

3. The method according to claim 2, which further comprises positioning the substrate within the chamber, wherein the chamber is equipped with two insulating elements in the form of discs, and two electrodes in the form of annular rings, such that the rear face of the substrate is in contact with a lower electrode and lower insulating element, and an upper electrode and upper insulating element are positioned a distance from the front face of the substrate.

4. The method according to claim 3, which further comprises:
   depositing the layer of protective material onto the peripheral annular zone with the aid of an isotropic plasma formed in the chamber,
   moving the upper insulating element towards the front face of the substrate to a lowered position;
   partially etching the protective material, while maintaining the upper insulating element in the lowered position;
   generating a partial etching plasma to thereby etch a thickness of the material constituting the substrate to be routed; and
   moving the upper insulating element away from the front face of the substrate for removing the ring of protective material.

5. The method according to claim 4, wherein the lower electrode and lower insulating element define a rear-face exclusion zone not accessible to the isotropic plasma, and the upper insulating element being positioned at a distance from the front face of the substrate so as to define a front-face exclusion zone also not accessible to the plasma, and the outer diameters of the upper and lower insulating elements are less than the diameter of the substrate to be routed, such that the unexcluded portion of the substrate constitutes the peripheral annular zone.

6. The method according to claim 5, wherein the diameter of the upper insulating element is less than or equal to the diameter of the non-chamfered plane zone of the front face of the substrate to be routed.

7. The method according to claim 1, wherein the protective material is a polymer.

8. The method according to claim 7, wherein the protective material is polyethylene, obtained by a plasma from $C_2H_4$.

9. The method according to claim 1, wherein the protective material is partially etched by an oxygen-based plasma.

10. The method according to claim 1, wherein the substrate to be routed is made of silicon; and the etching plasma is based on a mixture of $SF_6$ and argon.

11. The method according to claim 1, wherein the substrate to be routed is covered with a layer of silicon oxide; and the etching plasma is based on a mixture of $CHF_3$ and nitrogen.

12. The method according to claim 1, wherein the substrate to be routed is made of silicon covered with a layer of silicon oxide, so that the etching of the silicon oxide layer, and the etching of a thickness of the silicon layer, are carried out successively.

13. The method according to claim 1, wherein the substrate to be routed comprises a weakened zone which extends in a plane parallel or substantially parallel to its front face, and in that the partial etching of the protective material is carried out so that the outer diameter of the ring of protective material formed in this way is less than or equal to the diameter of the non-chamfered plane zone of the front face, such that the material constituting the substrate to be routed can be etched over a width of at least all of the chamfered zone.

14. The method according to claim 1, wherein the substrate to be routed comprises a weakened zone which extends in a plane parallel or substantially parallel to its front face, and in that it is etched over a thickness corresponding to the depth of the weakened zone.

15. A method for fabricating a composite substrate which comprises:
    forming a weakened zone at a depth within a donor substrate, so as to delimit thereon a layer to be transferred from the donor substrate to a handle substrate;
    subjecting the donor substrate to a routing method according to claim 1;
    bonding the routed donor substrate to a handle substrate by molecular adhesion; and
    carrying out a treatment for separating the layer to be transferred along the weakened zone, so as to transfer it onto the handle substrate.

16. The method according to claim 15, wherein the weakened zone is formed by implantation of atomic or ionic species.

* * * * *